United States Patent
Harada et al.

US006875556B2

(10) Patent No.: US 6,875,556 B2
(45) Date of Patent: Apr. 5, 2005

(54) RESIST COMPOSITIONS AND PATTERNING PROCESS

(75) Inventors: Yuji Harada, Niigata-ken (JP); Jun Hatakeyama, Niigata-ken (JP); Yoshio Kawai, Niigata-ken (JP); Masaru Sasago, Hirakata (JP); Masayuki Endo, Kishiwada (JP); Shinji Kishimura, Itami (JP); Kazuhiko Maeda, Tokyo (JP); Haruhiko Komoriya, Kawagoe (JP); Satoru Miyazawa, Kawagoe (JP)

(73) Assignees: Shin-Etsu Chemical Co., Ltd., Tokyo (JP); Matsushita Electric Industrial Co., Ltd., Osaka (JP); Central Glass Co., Ltd., Yamaguchi-ken (JP)

( * ) Notice: Subject to any disclaimer, the term of this patent is extended or adjusted under 35 U.S.C. 154(b) by 0 days.

(21) Appl. No.: 10/690,777

(22) Filed: Oct. 23, 2003

(65) Prior Publication Data
US 2004/0144752 A1 Jul. 29, 2004

(30) Foreign Application Priority Data
Oct. 25, 2002 (JP) ........................................ 2002-310572

(51) Int. Cl.$^7$ .............................................. G03F 7/004
(52) U.S. Cl. .................... 430/270.1; 430/326; 430/907; 430/910
(58) Field of Search .............................. 430/270.1, 326, 430/904, 910

(56) References Cited

U.S. PATENT DOCUMENTS

| | | | |
|---|---|---|---|
| 4,491,628 A | 1/1985 | Ito et al. | |
| 5,310,619 A | 5/1994 | Crivello et al. | |

FOREIGN PATENT DOCUMENTS

| | | | |
|---|---|---|---|
| JP | 63-27829 A | 2/1988 | |
| JP | 2-27660 B2 | 6/1990 | |
| JP | 9-73173 A | 3/1997 | |
| JP | 9-230595 A | 9/1997 | |
| JP | 10-10739 A | 1/1998 | |
| JP | 2001-146505 A | 5/2001 | |
| WO | WO 97/33198 A1 | 9/1997 | |

OTHER PUBLICATIONS

Ito et al., Proc. SPIE, vol. 4345, pp. 273–284 (2001).
Kodama et al., Proc. SPIE, vol. 4690, pp. 76–83 (2002).

*Primary Examiner*—Rosemary Ashton
(74) *Attorney, Agent, or Firm*—Birch, Stewart, Kolasch & Birch, LLP

(57) ABSTRACT

A resist composition comprising as the base resin a blend of a fluorinated polymer which is sensitive to high-energy radiation and highly transparent at a wavelength of up to 200 nm and a sulfonate-containing polymer exhibiting a high contrast upon alkali dissolution is improved in transparency and alkali dissolution contrast as well as plasma etching resistance.

9 Claims, No Drawings

RESIST COMPOSITIONS AND PATTERNING PROCESS

This Nonprovisional application claims priority under 35 U.S.C. § 119 (a) on Patent Application No(s). 2002-310572 filed in Japan on Oct. 25, 2002, the entire contents of which are hereby incorporated by reference.

BACKGROUND OF THE INVENTION

1. Field of the Invention

This invention relates to resist compositions, especially chemically amplified positive resist compositions suited for lithographic microfabrication, and a patterning process using the same.

2. Background Art

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. To the demand for a resist material with a higher resolution and sensitivity, chemical amplification positive working resist materials which are catalyzed by acids generated upon light exposure are effective as disclosed in U.S. Pat. No. 4,491,628 and U.S. Pat. No. 5,310,619 (JP-B 2-27660 and JP-A 63-27829). They now become predominant resist materials especially adapted for deep UV lithography.

Also, the change-over from i-line (365 nm) to shorter wavelength KrF laser (248 nm) brought about a significant innovation. Resist materials adapted for KrF excimer lasers enjoyed early use on the 0.30 micron process, passed through the 0.25 micron rule, and currently entered the mass production phase on the 0.18 micron rule. Engineers have started investigation on the 0.10 micron rule or less, with the trend toward a finer pattern rule being accelerated.

For ArF laser (193 nm), it is expected to enable miniaturization of the design rule to 0.13 μm or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

With respect to $F_2$ laser (157 nm) which is expected to enable further miniaturization to 0.10 μm or less, more difficulty arises in insuring transparency because it was found that acrylic resins which are used as the base resin for ArF are not transmissive to light at all and those cycloolefin resins having carbonyl bonds have strong absorption. It was also found that poly(vinyl phenol) which is used as the base resin for KrF has a window for absorption in proximity to 160 nm, so the transmittance is somewhat improved, but far below the practical level.

Since carbonyl groups and carbon-to-carbon double bonds have absorption in proximity to 157 nm as mentioned above, reducing the number of such units is considered to be one effective way for improving transmittance. It was recently found that introducing fluorine atoms into base polymers makes a great contribution to an improvement in transparency in the $F_2$ laser region.

It was reported, for example, in SPIE 2001, Proceedings 4345-31, "Polymer design for 157 nm chemically amplified resists" that in resist compositions comprising a copolymer of tert-butyl α-trifluoromethylacrylate with 5-(2-hydroxy-2,2-bistrifluoromethyl)ethyl-2-norbornene and a copolymer of tert-butyl α-trifluoromethylacrylate with 4-(2-hydroxy-2,2-bistrifluoromethyl)methylstyrene, the absorbance of the polymer at 157 nm is improved to about 3. However, this resin is still insufficient in transparency because it is believed that an absorbance of 2 or less is necessary to form a rectangular pattern at a film thickness of at least 2,000 Å through $F_2$ exposure.

The present inventors found that incorporating fluorinated vinyl sulfonate units into the above-described α-trifluoromethylacrylate polymer system improves the transparency while maintaining the substrate adherence and developer affinity of the resin. Even with this system, the absorbance is still about 2.

In this regard, a highly transparent resin having an absorbance of up to 1 is described in SPIE 2002, Proceedings 4690-09, "Synthesis of novel fluoropolymers for 157 nm photoresists by cyclo-polymerization." This polymer has not only high transparency, but also good substrate adherence. Since alcoholic groups are used as soluble groups, however, this resin has the drawback of a low dissolution rate in over-exposed areas where acid-eliminatable groups have been eliminated.

SUMMARY OF THE INVENTION

An object of the invention is to provide a resist composition, especially a chemically amplified positive resist composition having a high transmittance to vacuum ultraviolet radiation of up to 300 nm, especially $F_2$ (157 nm), $Kr_2$ (146 nm), KrAr (134 nm) and $Ar_2$ (126 nm) laser beams, and a patterning process using the same.

It has been found that using as the base resin a blend of a highly transparent polymer comprising recurring units of the general formulae (1a) and (1b), shown below, and another polymer comprising fluorinated vinyl sulfonate units, especially a polymer comprising recurring units of the general formulae (2a), (2b) and (2c), shown below, or a polymer comprising recurring units of the general formulae (3a), (3b) and (3c), shown below, a resist composition, especially a chemically amplified positive resist composition, having a high contrast enough to form a high aspect ratio pattern having a substantial film thickness is formulated without detracting from transparency.

In one aspect, the present invention provides a resist composition comprising as the base resin a polymer comprising recurring units of the following general formulae (1a) and (1b) and another polymer comprising recurring units containing sulfonate.

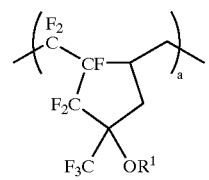
(1a)

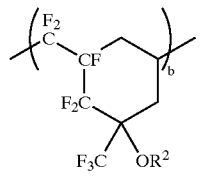
(1b)

Herein $R^1$ and $R^2$ each are hydrogen or an acid labile group, "a" and "b" are numbers satisfying $0<a<1$, $0<b<1$ and $0<a+b\leq 1$.

For the other polymer, the recurring units containing sulfonate are preferably represented by the general formulae (2a), (2b) and (2c).

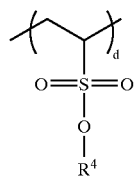
(2a)

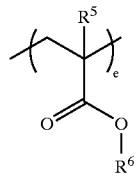
(2b)

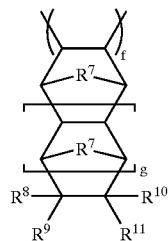
(2c)

Herein $R^4$ is a substituent group containing at least one fluorine atom, $R^5$ is a fluorine atom or a fluorinated alkyl group having 1 to 4 carbon atoms, $R^6$ is an acid labile group, $R^7$ is a methylene group, oxygen atom or sulfur atom, $R^8$ to $R^{11}$ are independently hydrogen, fluorine, $-R^{12}-OR^{13}$, $-R^{12}-CO_2R^{13}$, or a straight, branched or cyclic alkyl or fluorinated alkyl group of 1 to 20 carbon atoms, at least one of $R^8$ to $R^{11}$ contains $-R^{12}-OR^{13}$ or $-R^{12}-CO_2R^{13}$, $R^{12}$ is a single bond or a straight, branched or cyclic alkylene or fluorinated alkylene group of 1 to 20 carbon atoms, $R^{13}$ is hydrogen or an acid labile group, d, e, and f are numbers satisfying $0<d<1$, $0\leq e<1$, $0\leq f<1$, and $0<d+e+f\leq 1$, and g is 0 or 1.

Alternatively, the recurring units containing sulfonate are preferably represented by the general formulae (3a), (3b) and (3c).

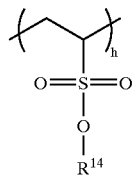
(3a)

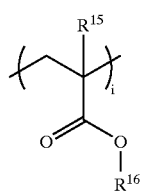
(3b)

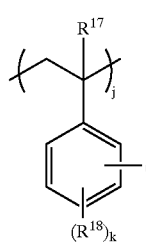
(3c)

Herein $R^{14}$ is a substituent group containing at least one fluorine atom, $R^{15}$ is a fluorine atom or a fluorinated alkyl group having 1 to 4 carbon atoms, $R^{16}$ is an acid labile group, $R^{17}$ is hydrogen, fluorine or a straight, branched or cyclic alkyl or fluorinated alkyl group of 1 to 20 carbon atoms, $R^{18}$ is fluorine or a straight, branched or cyclic fluorinated alkyl group of 1 to 20 carbon atoms, $R^{19}$ is a single bond or a straight, branched or cyclic alkylene or fluorinated alkylene group of 1 to 20 carbon atoms, $R^{20}$ is hydrogen or an acid labile group, h, i, and j are numbers satisfying $0<h<1$, $0\leq i<1$, $0\leq j<1$, and $0<h+i+j\leq 1$, k is an integer of 0 to 4, m is 1 or 2, and $1\leq k+m\leq 5$.

In a preferred embodiment, the fluorinated substituent group represented by $R^4$ in formula (2a) or $R^{14}$ in formula (3a) has any of the formulae (4a) to (4e).

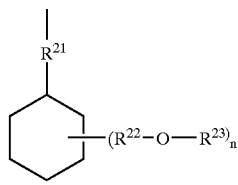
(4a)

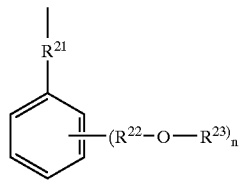
(4b)

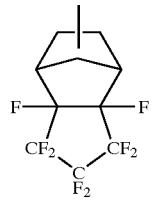
(4c)

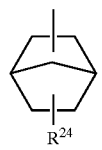
(4d)

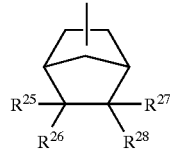
(4e)

Herein $R^{21}$ and $R^{22}$ each are a straight, branched or cyclic fluorinated alkylene group of 1 to 20 carbon atoms, $R^{23}$ is hydrogen or an acid labile group, $R^{24}$ is a straight, branched or cyclic fluorinated alkyl group of 1 to 10 carbon atoms, $R^{25}$ to $R^{28}$ are independently hydrogen, fluorine, —$R^{29}$—$OR^{30}$, —$R^{29}$—$CO_2R^{30}$, or a straight, branched or cyclic alkyl or fluorinated alkyl group of 1 to 20 carbon atoms, at least one of $R^{25}$ to $R^{28}$ contains —$R^{29}$—$OR^{30}$ or —$R^{29}$—$CO_2R^{30}$, $R^{29}$ is a single bond or a straight, branched or cyclic alkylene or fluorinated alkylene group of 1 to 20 carbon atoms, $R^{30}$ is hydrogen or an acid labile group, and n is 1 or 2.

Specifically, the present invention provides a chemically amplified positive resist composition comprising (A) a blend of the polymers set forth above, (B) an organic solvent, (C) a photoacid generator, and optionally, (D) a basic compound and (E) a dissolution inhibitor.

In another aspect, the present invention provides a process for forming a resist pattern comprising the steps of applying the resist composition onto a substrate to form a coating; heat treating the coating and then exposing it to high-energy radiation in a wavelength band of 100 to 180 nm or 1 to 30 nm through a photomask; and optionally heat treating the exposed coating and developing it with a developer. The high-energy radiation is typically an $F_2$ laser beam, $Ar_2$ laser beam or soft x-ray.

DESCRIPTION OF THE PREFERRED EMBODIMENTS

Polymers

As noted above, reducing the number of carbonyl groups and/or carbon-to-carbon double bonds is contemplated to be one effective way for improving the transmittance in proximity to 157 nm. It was also found that introducing fluorine atoms into base polymers makes a great contribution to improved transmittance. In fact, poly(vinyl phenol) having fluorine introduced in its aromatic rings had an improved transmittance (see JP-A 2001-146505). However, this base polymer was found to turn to be negative upon exposure to high-energy radiation as from an $F_2$ laser, interfering with its use as a practical resist. Also, those polymers obtained by introducing fluorine into acrylic resins or polymers containing in their backbone an alicyclic compound originating from a norbornene derivative were found to have an outstandingly improved transparency and eliminate the negative turning problem. However, it was found that an attempt to increase the rate of introduction of fluorine in order to enhance transparency tended to exacerbate the substrate adherence and developer penetration of the resin.

In contrast, resins comprising units of sulfonic acid esters were found to have a relatively high transmittance at about 157 nm despite the inclusion of two sulfur-to-oxygen double bonds, and be significantly improved in substrate adherence and developer penetration over the aforementioned fluorinated polymers. However, these resins have an absorbance insufficient to form a rectangular pattern at a film thickness of at least 2,000 Å through $F_2$ exposure. A further improvement in transparency is needed.

It has been found that a resist composition featuring high transparency, substrate adherence and developer penetration is obtainable using a highly transparent polymer comprising recurring units of the general formulae (1a) and (1b), shown below, and having an absorbance of up to 1 in combination with a polymer comprising recurring units containing fluorinated vinyl sulfonic acid ester, especially a polymer comprising recurring units of the general formulae (2a), (2b) and (2c), shown below, or a polymer comprising recurring units of the general formulae (3a), (3b) and (3c), shown below, which is simply referred to as Polymer (2) or (3), respectively. Using this resist composition, a pattern having a high contrast and high aspect ratio can be formed.

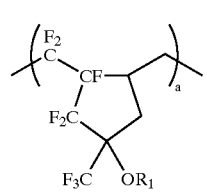
(1a)

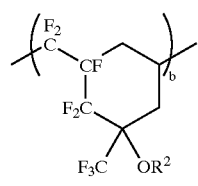
(1b)

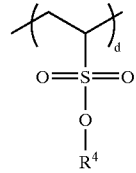
(2a)

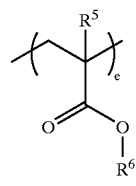
(2b)

-continued

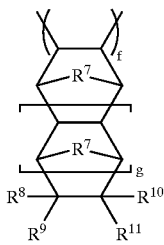

(2c)

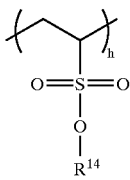

(3a)

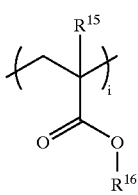

(3b)

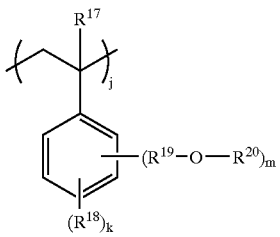

(3c)

In the formulae, $R^1$ and $R^2$ each are hydrogen or an acid labile group;

$R^4$ is a substituent group containing at least one fluorine atom, $R^5$ is a fluorine atom or a fluorinated alkyl group having 1 to 4 carbon atoms, $R^6$ is an acid labile group, $R^7$ is a methylene group, oxygen atom or sulfur atom, $R^8$ to $R^{11}$ are independently hydrogen, fluorine, —$R^{12}$—$OR^{13}$, —$R^{12}$—$CO_2R^{13}$, or a straight, branched or cyclic alkyl or fluorinated alkyl group of 1 to 20 carbon atoms, at least one of $R^8$ to $R^{11}$ contains —$R^{12}$—$OR^{13}$ or —$R^{12}$—$CO_2R^{13}$, $R^{12}$ is a single bond or a straight, branched or cyclic alkylene or fluorinated alkylene group of 1 to 20 carbon atoms, $R^{13}$ is hydrogen or an acid labile group;

$R^{14}$ is a substituent group containing at least one fluorine atom, $R^{15}$ is a fluorine atom or a fluorinated alkyl group having 1 to 4 carbon atoms, $R^{16}$ is an acid labile group, $R^{17}$ is hydrogen, fluorine or a straight, branched or cyclic alkyl or fluorinated alkyl group of 1 to 20 carbon atoms, $R^{18}$ is fluorine or a straight, branched or cyclic fluorinated alkyl group of 1 to 20 carbon atoms, $R^{19}$ is a single bond or a straight, branched or cyclic alkylene or fluorinated alkylene group of 1 to 20 carbon atoms, $R^{20}$ is hydrogen or an acid labile group;

the subscripts a and b are numbers satisfying $0<a<1$, $0<b<1$ and $0<a+b\leq 1$; d, e, and f are numbers satisfying $0<d<1$, $0\leq e<1$, $0\leq f<1$, and $0<d+e+f\leq 1$, and g is 0 or 1; h, i, and j are numbers satisfying $0<h<1$, $0\leq i<1$, $0\leq j<1$, and $0<h+i+j\leq 1$, k is an integer of 0 to 4, m is 1 or 2, and $1\leq k+m\leq 5$.

The polymer comprising recurring units of formulae (1a) and (1b) can be synthesized through radical ring-closing polymerization of a monomer as shown below.

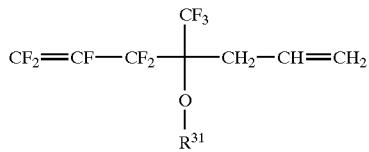

Herein $R^{31}$ is hydrogen or an acid labile group. The methods of introducing acid labile groups as $R^1$ and $R^2$ include a method of first substituting an acid labile group for the hydrogen atom of a hydroxyl group on the monomer prior to polymerization and a method of first polymerizing the monomer wherein $R^1$ and $R^2$ are hydrogen and then substituting acid labile groups for the hydrogen atoms of hydroxyl groups on the polymer. Either method may be used to introduce acid labile groups.

During ring-closing polymerization, 5- and 6-membered rings are formed in admixture. The 6-membered rings include units represented by formula (1b), optionally in admixture with recurring units having the general formula (1c). The polymer comprising units of formulae (1a), (1b) and (1c) is simply referred to as Polymer (1), hereinafter.

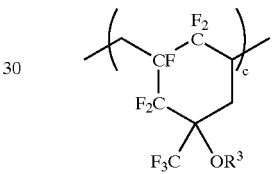

(1c)

In the formula, $R^3$ is hydrogen or an acid labile group, $0\leq c<1$, and $a+b+c=1$.

Polymer (1) has a varying ratio of a, b and c, depending on the polymerization conditions. Preferably both a and b are in a range of 0.2 to 0.8, especially in a range of 0.2 to 0.6, and c is in a range of 0 to 0.6, especially in a range of 0 to 0.45. The rate of substitution of acid labile groups is preferably in a range of 3 to 50 mol %, more preferably 5 to 40 mol % based on the entire hydroxyl groups.

In the polymer comprising recurring units containing fluorinated vinyl sulfonic acid ester, the fluorinated substituent groups represented by $R^4$ in formula (2a) and $R^{14}$ in formula (3a) are selected from a variety of such substituent groups, preferably substituent groups of the following general formulae (4a) to (4e).

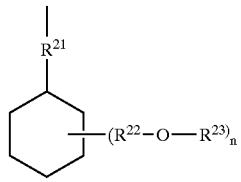

(4a)

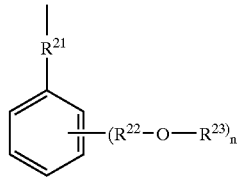

(4b)

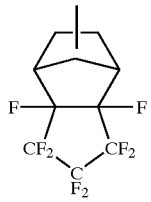

(4c)

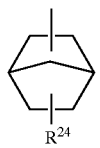

(4d)

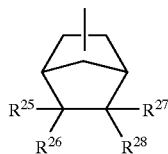

(4e)

Herein $R^{21}$ and $R^{22}$ each are a straight, branched or cyclic fluorinated alkylene group of 1 to 20 carbon atoms, $R^{23}$ is hydrogen or an acid labile group, $R^{24}$ is a straight, branched or cyclic fluorinated alkyl group of 1 to 10 carbon atoms, $R^{25}$ to $R^{28}$ are independently hydrogen, fluorine, —$R^{29}$—$OR^{30}$, —$R^{29}$—$CO_2R^{30}$, or a straight, branched or cyclic alkyl or fluorinated alkyl group of 1 to 20 carbon atoms, at least one of $R^{25}$ to $R^{28}$ contains —$R^{29}$—$OR^{30}$ or —$R^{29}$—$CO_2R^{30}$, $R^{29}$ is a single bond or a straight, branched or cyclic alkylene or fluorinated alkylene group of 1 to 20 carbon atoms, $R^{30}$ is hydrogen or an acid labile group, and n is 1 or 2.

In the formulae (1a) to (4e), suitable straight, branched or cyclic alkyl groups of 1 to 20 carbon atoms include methyl, ethyl, propyl, isopropyl, n-propyl, n-butyl, sec-butyl, tert-butyl, cyclopentyl, cyclohexyl, cyclohexylmethyl, 2-ethylhexyl, n-octyl, 2-adamantyl, and (2-adamantyl)methyl, with those groups of 1 to 12 carbon atoms, especially 1 to 10 carbon atoms being preferred.

The fluorinated alkyl groups correspond to the foregoing alkyl groups in which some or all of the hydrogen atoms are replaced by fluorine atoms. Examples include, but are not limited to, trifluoromethyl, 2,2,2-trifluoroethyl, 3,3,3-trifluoropropyl, 1,1,1,3,3,3-hexafluoroisopropyl, and 1,1,2,2,3,3,3-heptafluoropropyl.

Suitable straight, branched or cyclic alkylene groups of 1 to 20 carbon atoms correspond to the foregoing alkyl groups with one hydrogen atom eliminated. Suitable fluorinated alkylene groups are similar alkylene groups which are partially or entirely substituted with fluorine atoms.

The acid labile groups represented by $R^1$ to $R^3$, $R^{13}$, $R^{16}$, $R^{20}$, $R^{23}$, $R^{30}$ and $R^{31}$ are selected from a variety of such groups, preferably from among the groups of the following general formulae (5) to (7).

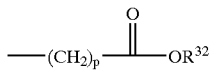

(5)

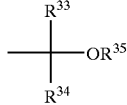

(6)

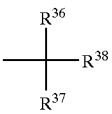

(7)

In formula (5), $R^{32}$ is a tertiary alkyl group of 4 to 20 carbon atoms, preferably 4 to 15 carbon atoms, or an oxoalkyl group of 4 to 20 carbon atoms. Suitable tertiary alkyl groups include tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Suitable oxoalkyl groups include 3-oxocyclohexyl, 4-methyl-2-oxooxan-4-yl, and 5-methyl-5-oxooxolan-4-yl. Letter p is an integer of 0 to 6.

Illustrative, non-limiting, examples of the acid labile group of formula (5) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

In formula (6), $R^{33}$ and $R^{34}$ are hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^{35}$ is a monovalent hydrocarbon group of 1 to 18 carbon atoms, preferably 1 to 10 carbon atoms, which may contain a hetero atom such as oxygen, for example, straight, branched or cyclic alkyl groups and substituted ones of these alkyl groups in which some hydrogen atoms are substituted with hydroxyl, alkoxy, oxo, amino or alkylamino groups. Exemplary substituted alkyl groups are shown below.

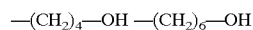

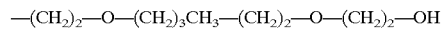

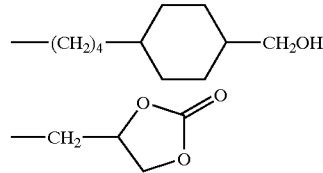

A pair of $R^{33}$ and $R^{34}$, a pair of $R^{33}$ and $R^{35}$, or a pair of $R^{34}$ and $R^{35}$ may bond together to form a ring. Each of $R^{33}$, $R^{34}$ and $R^{35}$ is a straight or branched alkylene group of 1 to 18 carbon atoms, preferably 1 to 10 carbon atoms, when they form a ring.

Of the acid labile groups of formula (6), straight or branched ones are exemplified by the following groups.

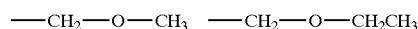

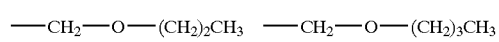

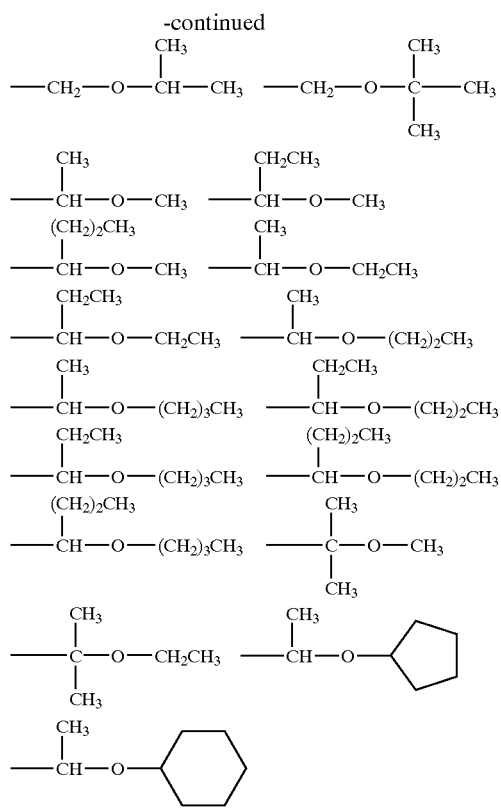

Of the acid labile groups of formula (6), cyclic ones are exemplified by tetrahydrofuran-2-yl, 2-methyltetrahydrofuran-2-yl, tetrahydropyran-2-yl, and 2-methyltetrahydropyran-2-yl.

Of the groups of formula (6), ethoxyethyl, butoxyethyl and ethoxypropyl are preferred.

In formula (7), $R^{36}$, $R^{37}$ and $R^{38}$ each are a monovalent hydrocarbon group, typically a straight, branched or cyclic alkyl group of 1 to 20 carbon atoms, which may contain a hetero atom such as oxygen, sulfur, nitrogen or fluorine. A pair of $R^{36}$ and $R^{37}$, $R^{36}$ and $R^{38}$, and $R^{37}$ and $R^{38}$, taken together, may form a ring with the carbon atom to which they are bonded.

Examples of the tertiary alkyl group represented by formula (7) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, tert-amyl, 1,1,1,3,3,3-hexafluoro-2-methyl-isopropyl, and 1,1,1,3,3,3-hexafluoro-2-cyclohexyl-isopropyl as well as the groups shown below.

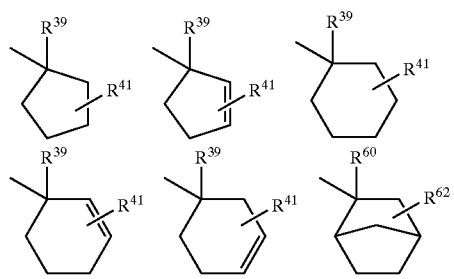

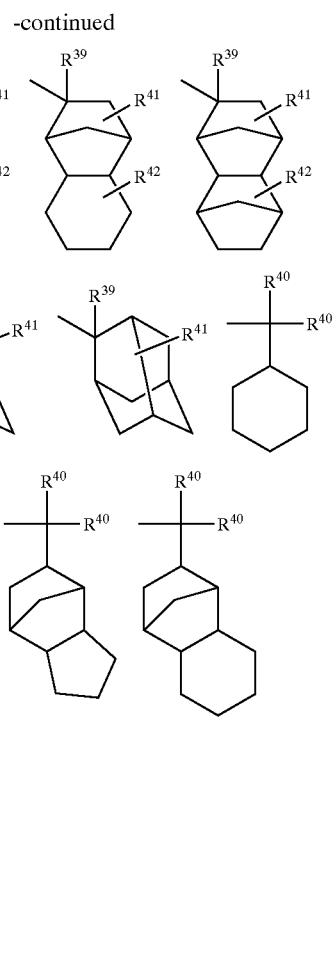

Herein, $R^{39}$ is a straight, branched or cyclic alkyl group of 1 to 6 carbon atoms, such as methyl, ethyl, propyl, isopropyl, n-butyl, sec-butyl, n-pentyl, n-hexyl, cyclopropyl, cyclopropylmethyl, cyclobutyl, cyclopentyl and cyclohexyl. $R^{40}$ is a straight, branched or cyclic alkyl group of 2 to 6 carbon atoms, such as ethyl, propyl, isopropyl, n-butyl, sec-butyl, n-pentyl, n-hexyl, cyclopropyl, cyclopropylmethyl, cyclobutyl, cyclopentyl and cyclohexyl. Each of $R^{41}$ and $R^{42}$ is hydrogen, a monovalent hydrocarbon group of 1 to 6 carbon atoms which may contain a hetero atom, or a monovalent hydrocarbon group of 1 to 6 carbon atoms which may be separated by a hetero atom. These groups may be straight, branched or cyclic. The hetero atom is typically selected from oxygen, sulfur and nitrogen atoms and may be contained or intervene in the form of —OH, —OR$^{43}$, —O—, —S—, —S(=O)—, —NH$_2$, —NHR$^{43}$, —N(R$^{43}$)$_2$, —NH— or —NR$^{43}$— wherein $R^{43}$ is a $C_{1-5}$ alkyl group. Examples of $R^{41}$ and $R^{42}$ groups include methyl, hydroxymethyl, ethyl, hydroxyethyl, propyl, isopropyl, n-butyl, sec-butyl, n-pentyl, n-hexyl, methoxy, methoxymethoxy, ethoxy and tert-butoxy.

Illustrative, non-limiting examples of the units having formulae (2a) and (3a) are given below.

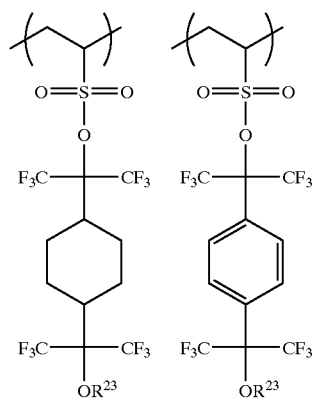
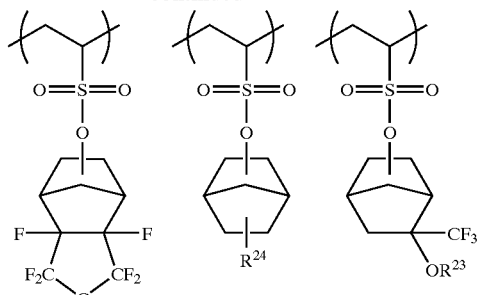
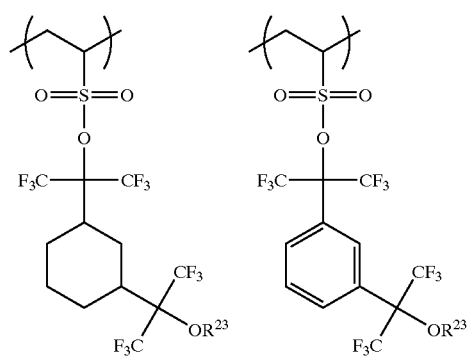
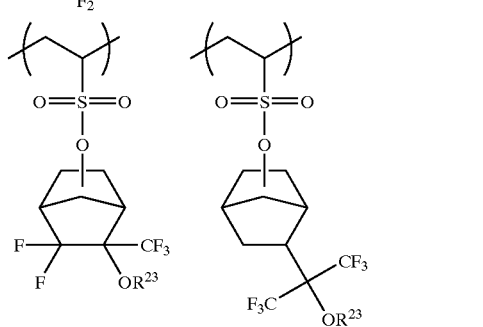
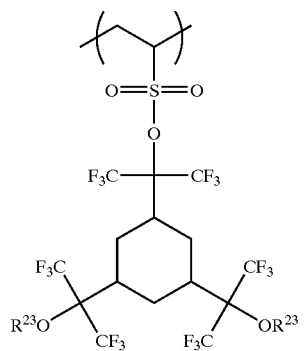
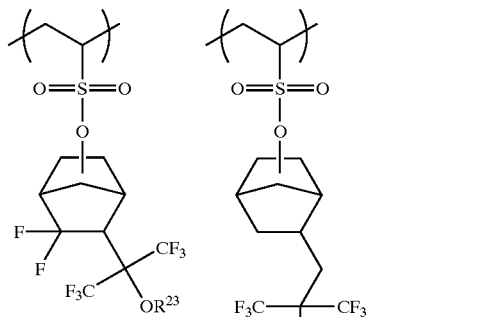
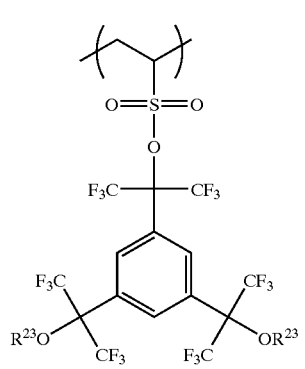
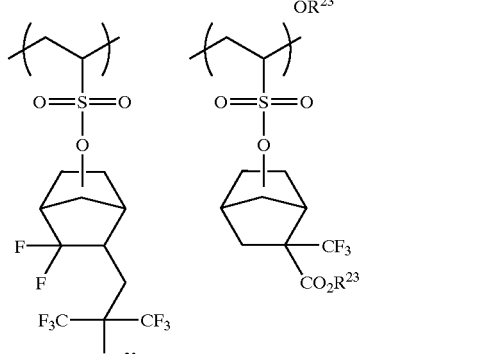
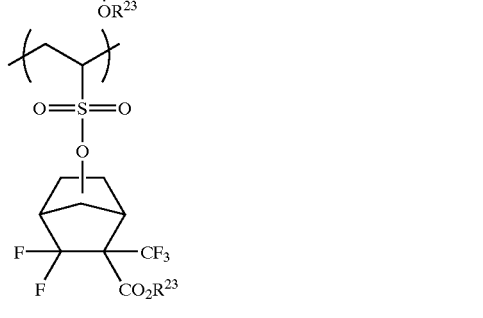
$R^{23}$ and $R^{24}$ are as defined above.

Illustrative, non-limiting examples of the units having formula (2c) are given below.
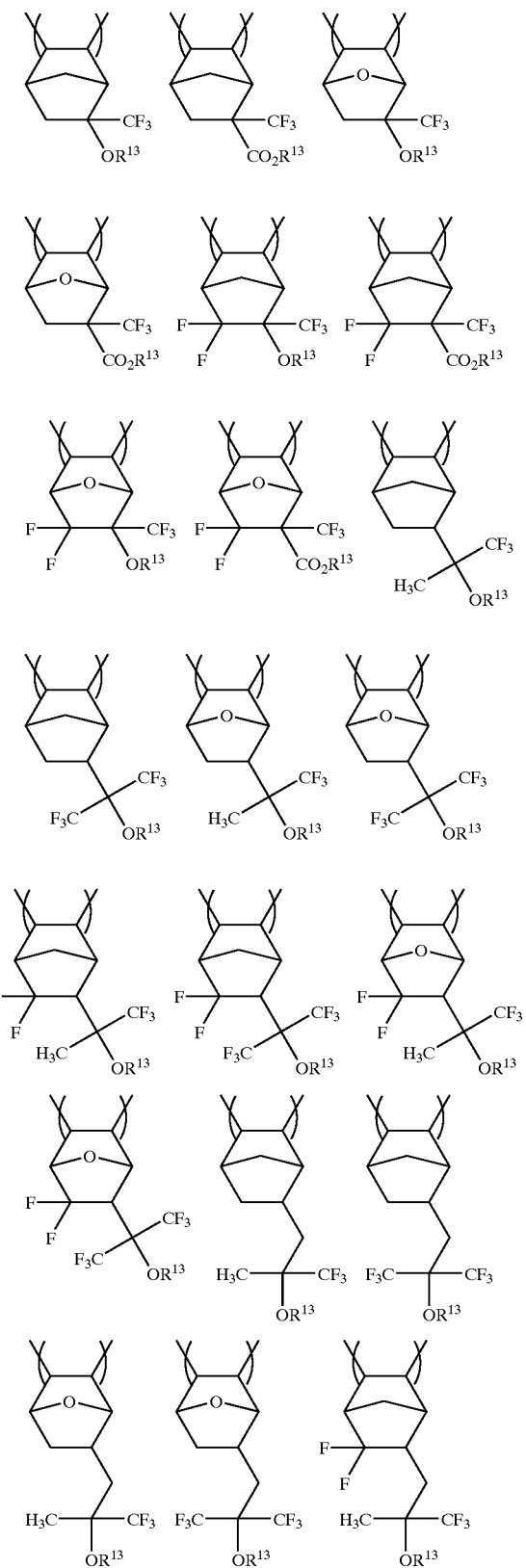
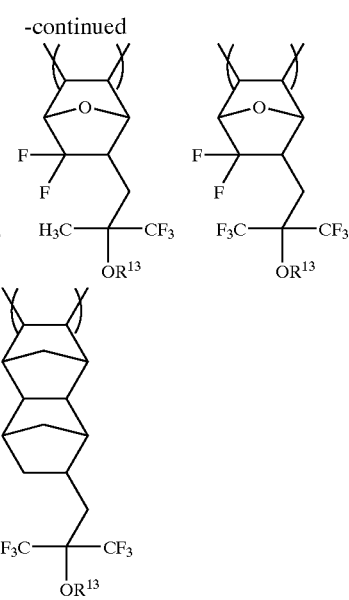
$R^{13}$ is as defined above.
Illustrative, non-limiting examples of the units having formula (3c) are given below.
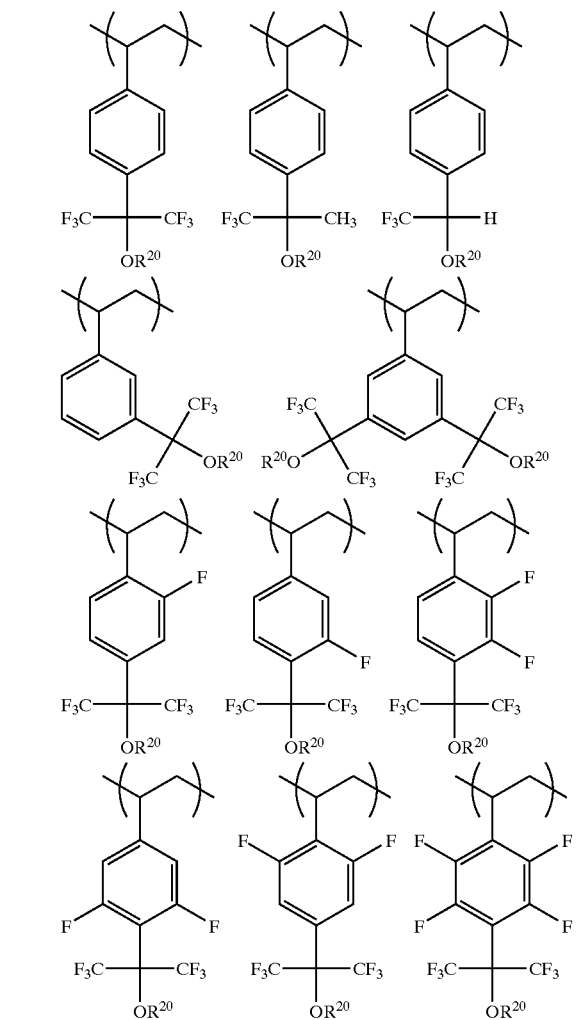

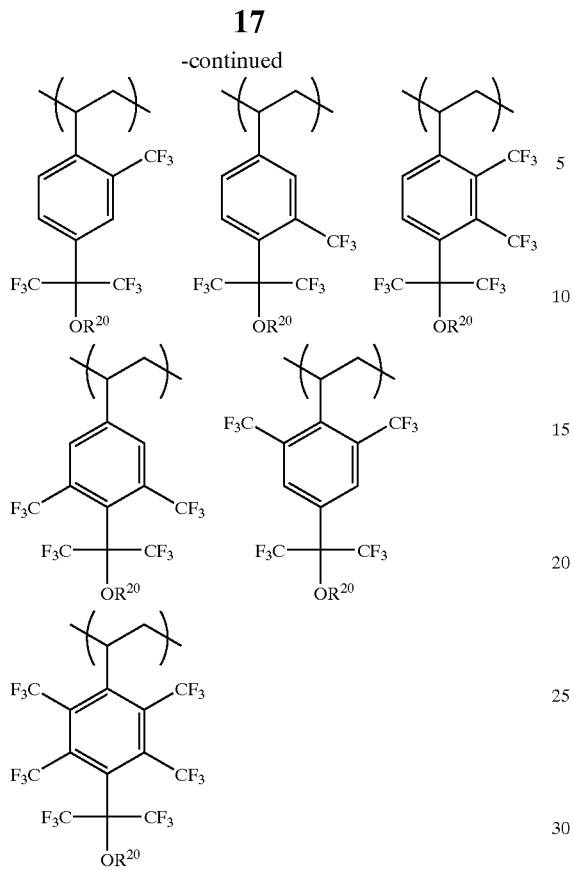

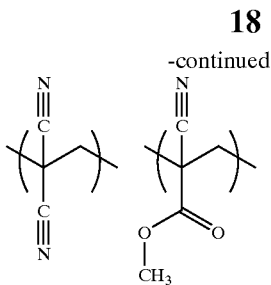

$R^{20}$ is as defined above.

In Polymers (2) and (3), adhesive units may be incorporated for the purpose of improving adhesion. Suitable adhesive units are shown below.

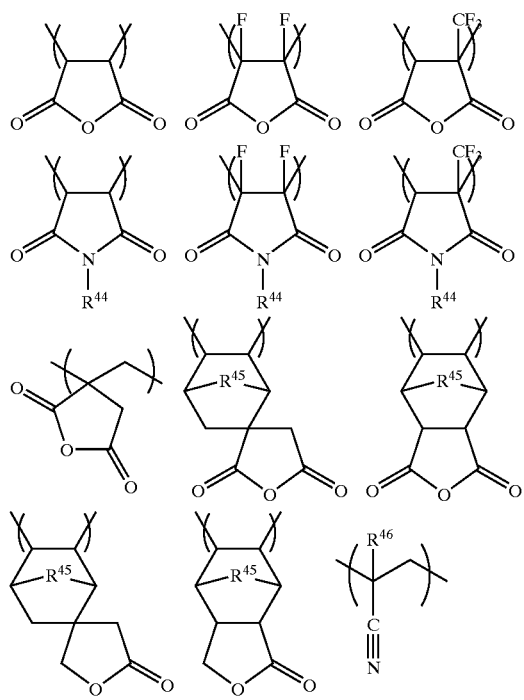

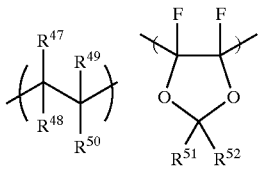

Herein, $R^{44}$ and $R^{46}$ each are a hydrogen atom, a fluorine atom or a straight, branched or cyclic alkyl or fluorinated alkyl group of 1 to 20 carbon atoms, and $R^{45}$ is a methylene group, oxygen atom or sulfur atom.

In Polymers (2) and (3), transparent units may be incorporated for the purpose of improving the transparency of the resin. Suitable transparent units are shown below.

Herein, $R^{47}$ to $R^{50}$ each are a hydrogen atom, a fluorine atom or a fluorinated alkyl group of 1 to 4 carbon atoms, at least one of $R^{47}$ to $R^{50}$ contains at least one fluorine atom, and $R^{51}$ and $R^{52}$ each are a hydrogen atom, a methyl group or a trifluoromethyl group.

In Polymer (2) wherein U21 represents units of formula (2a), U22 represents units of formula (2b), U23 represents units of formula (2c), U24 represents adhesive and transparent units other than the foregoing, and U21+U22+U23+U24=1, U's are preferably in the range:
0<U21≦0.9, more preferably 0.1≦U21≦0.5,
0≦U22≦0.8, more preferably 0≦U22≦0.5,
0≦U23≦0.8, more preferably 0≦U23≦0.6, and
0≦U24≦0.3, more preferably 0≦U24≦0.2.

In Polymer (3) wherein U31 represents units of formula (3a), U32 represents units of formula (3b), U33 represents units of formula (3c), U34 represents adhesive and transparent units other than the foregoing, and U31+U32+U33+U34=1, U's are preferably in the range:
0<U31≦0.9, more preferably 0.1≦U31≦0.5,
0≦U32≦0.8, more preferably 0≦U32≦0.5,
0≦U33≦0.8, more preferably 0≦U33≦0.6, and
0≦U34≦0.3, more preferably 0≦U34≦0.2.

Desirably Polymer (1), Polymer (2) and Polymer (3) each have a weight average molecular weight of about 1,000 to about 1,000,000, and especially about 2,000 to about 100,000.

The blend ratio of Polymer (1) to Polymer (2) and the blend ratio of Polymer (1) to Polymer (3) each are desirably in a range from 0.3/0.7 to 0.9/0.1, more desirably from 0.4/0.6 to 0.85/0.15, on a weight basis. Polymer (2) or (3) to be blended with Polymer (1) may be a single polymer or a mixture of two or more polymers. The blend of Polymer (1) with Polymer (2) or (3) is simply referred to as "polymer blend."

The polymer blend of the invention can be used as a base resin in resist compositions, specifically chemical amplification type resist compositions, and especially chemical amplification type positive working resist compositions. It is understood that the polymer blend may be admixed with another polymer for the purpose of altering the dynamic properties, thermal properties, alkali solubility and other physical properties of polymer film. The type of the other polymer which can be admixed is not critical. Any of polymers known to be useful in resist use may be admixed in any desired proportion.

Resist Composition

As long as the polymer blend of the invention is used as a base resin, the resist composition of the invention may be prepared using well-known components. In a preferred embodiment, the chemically amplified positive resist composition is defined as comprising (A) the inventive polymer blend as a base resin, (B) an organic solvent, and (C) a photoacid generator. In the resist composition, there may be further formulated (D) a basic compound and/or (E) a dissolution inhibitor.

Component (B)

The organic solvent used as component (B) in the invention may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone.

Also useful are fluorinated organic solvents. Examples include 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluoroethanbl, ethyl heptafluorobutylacetate, ethyl hexafluoroglutarylmethyl, ethyl 3-hydroxy-4,4,4-trifluoroacetoacetate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluoropyruvate, sec-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro-2,5-dimethyl-3,6-dioxane anionic acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxa-octadecane, perfluorotributylamine, perfluorotrihexylamine, perfluoro-2,5,8-trimethyl-3,6,9,12,15-pentaoxaoctadecane, perfluorotributylamine, perfluorotrihexylamine, methyl perfluoro-2,5,8-trimethyl-3,6,9-trioxadodecanoate, perfluorotripentylamine, perfluorotriisopropylamine, 1H,1H,2H,3H,3H-perfluoroundecane-1,2-diol, trifluorobutanol, 1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexane, propylene glycol trifluoromethyl ether, butyl trifluoroacetate, and 1,1,1-trifluoro-5,5-dimethyl-2,4-hexanedione.

These solvents may be used alone or in combinations of two or more thereof. Of the above organic solvents, preferred are diethylene glycol dimethyl ether and 1-ethoxy-2-propanol, in which the photoacid generator is most soluble, and propylene glycol monomethyl ether acetate which is safe, and mixtures thereof.

The solvent is preferably used in an amount of about 300 to 10,000 parts by weight, more preferably about 500 to 5,000 parts by weight per 100 parts by weight of the base resin.

Component (C)

The photoacid generator is a compound capable of generating an acid upon exposure to high energy radiation or electron beams and includes the following:
(i) onium salts of the formula (P1a-1), (P1a-2) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These photoacid generators are described in detail.
(i) Onium Salts of Formula (P1a-1), (P1a-2) or (P1b):

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a non-nucleophilic counter ion.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by K$^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

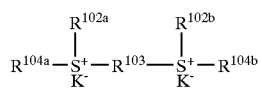

(P1b)

Herein, $R^{102a}$ and $R^{102b}$ independently represent straight, branched or cyclic alkyl groups of 1 to 8 carbon atoms. $R^{103}$ represents a straight, branched or cyclic alkylene group of 1 to 10 carbon atoms. $R^{104a}$ and $R^{104b}$ independently represent 2-oxoalkyl groups of 3 to 7 carbon atoms. K$^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by K$^-$ are the same as exemplified for formulae (P1a-1) and (P1a-2).

(ii) Diazomethane Derivatives of Formula (P2)

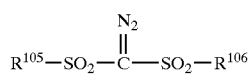

(P2)

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

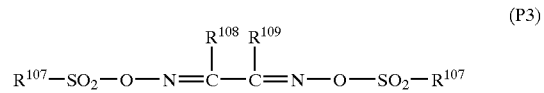

(P3)

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

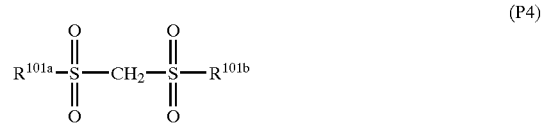

(P4)

Herein, $R^{101a}$ and $R^{101b}$ are as defined above.

(v) Sulfonic Acid Esters of N-hydroxyimide Compounds of Formula (P5)

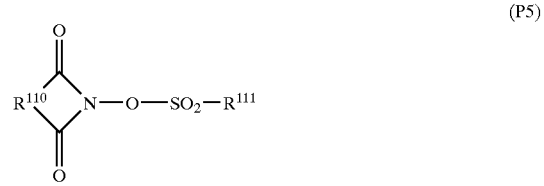

(P5)

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutoxy, and tert-butoxy. The phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the photoacid generator include:
onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethane-sulfonate, bis(p-tert-butoxyphenyl)phenylsulfonium trifluoromethane-sulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethane-sulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethane-sulfonate, (2-norbornyl)methyl(2-oxocyclohexyl)sulfonium trifluoromethanesulfonate, ethylenebis[methyl(2-oxocyclopentyl)sulfonium trifluoro-methanesulfonate], and 1,2'-naphthylcarbonylmethyltetrahydrothiophenium triflate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;

β-ketosulfone derivatives such as 2-cyclohexylcarbonyl-2-(p-toluenesulfonyl)propane and 2-isopropylcarbonyl-2-(p-toluenesulfonyl)propane;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and sulfonic acid esters of N-hydroxyimides such as N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate, N-hydroxy-5- norbornene-2,3-dicarboxyimide trifluoromethane-sulfonate, and N-hydroxy-5-norbornene-2,3-dicarboxyimide p-toluenesulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethane-sulfonate, (2-norbornyl)methyl(2-oxocylohexyl)sulfonium trifluoromethanesulfonate, and 1,2'-naphthylcarbonylmethyltetrahydrothiophenium triflate;

diazomethane derivatives such as bis(benzenesulfonyl) diazomethane, bis(p-toluenesulfonyl)diazomethane, bis(cyclohexylsulfonyl)diazomethane, bis(n-butylsulfonyl) diazomethane, bis(isobutylsulfonyl)diazomethane, bis(sec-butylsulfonyl)diazomethane, bis(n-propylsulfonyl) diazomethane, bis(isopropylsulfonyl)diazomethane, and bis(tert-butylsulfonyl)diazomethane;

glyoxime derivatives such as bis-O-(p-toluenesulfonyl)-α-dimethylglyoxime and bis-O-(n-butanesulfonyl)-α-dimethylglyoxime;

bissulfone derivatives such as bisnaphthylsulfonylmethane; and sulfonic acid esters of N-hydroxyimide compounds such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is added in an amount of 0.1 to 50 parts, and especially 0.5 to 40 parts by weight, per 100 parts by weight of the base resin (all parts are by weight, hereinafter). Less than 0.1 part of the photoacid generator may generate a less amount of acid upon exposure, sometimes leading to a poor sensitivity and resolution whereas more than 50 parts of the photoacid generator may adversely affect transparency and resolution.

Component (D)

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene. Examples of suitable heterocyclic amines include pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture.

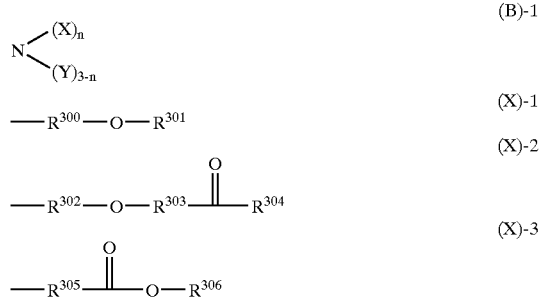

In the formulas, n is 1, 2 or 3. The side chain X may be the same or different and is represented by the formula (X)-1, (X)-2 or (X)-3. The side chain Y may be the same or different and stands for hydrogen or a straight, branched or cyclic alkyl group of 1 to 20 carbon atoms which may contain an ether or hydroxyl group. Two or three X's may bond together to form a ring.

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl group, ether, ester or lactone ring; and $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl group, ether, ester or lactone ring.

Illustrative, non-limiting examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy) ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl) amine, N,N-bis(2-hydroxyethyl)-2-(methoxycarbonyl) ethylamine, N,N-bis(2-acetoxyethyl)-2-(methoxycarbonyl) ethylamine, N,N-bis(2-hydroxyethyl)-2-(ethoxycarbonyl) ethylamine, N,N-bis(2-acetoxyethyl)-2-(ethoxycarbonyl) ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl) ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl) methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl] amine, N-(2-methoxyethyl)-bis[2-(methoxycarbonyl)ethyl] amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl) amine, N-ethyl-bis[2-(methoxycarbonyloxy)ethyl]amine, N-ethyl-bis[2-(tert-butoxycarbonyloxy)ethyl]amine, tris (methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more of cyclic structure-bearing basic compounds having the following general formula (B)-2.

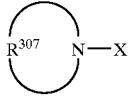

(B)-2

Herein X is as defined above, and $R^{307}$ is a straight or branched alkylene group of 2 to 20 carbon atoms which may contain one or more carbonyl, ether, ester or sulfide groups.

Illustrative examples of the cyclic structure-bearing basic compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino) propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl) propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-bearing basic compounds having the following general formulae (B)-3 to (B)-6 may be blended.

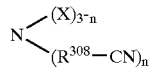

(B)-3

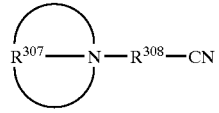

(B)-4

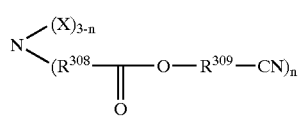

(B)-5

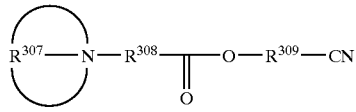

(B)-6

Herein, X, $R^{307}$ and n are as defined above, and $R^{308}$ and $R^{309}$ each are independently a straight or branched alkylene group of 1 to 4 carbon atoms.

Illustrative examples of the cyano-bearing basic compounds include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-( 2-cyanoethyl) -N-(2-hydroxyethyl) -3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiono-nitrile, N-(2-cyanoethyl)-N-(3-hydroxy-1-propyl)-3-aminopropiono-nitrile, N-(3-acetoxy-1-propyl)-N-(2-cyanoethyl)-3-aminopropiono-nitrile, N-(2-cyanoethyl)-N-(3-formyloxy-1-propyl)-3-aminopropiono-nitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl) aminoacetonitrile, N,N-bis(2-acetoxyethyl) aminoacetonitrile, N,N-bis(2-formyloxyethyl) aminoacetonitrile, N,N-bis(2-methoxyethyl) aminoacetonitrile, N,N-bis[2-(methoxymethoxy)ethyl] aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl] aminoacetonitrile, N-cyanomethyl-N-(3-hydroxy-1-propyl) aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis (cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis (2-methoxyethyl)-3-aminopropionate, cyanomethyl N,N-bis [2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

These basic compounds may be used alone or in admixture of any. The basic compound is preferably formulated in an amount of 0.001 to 2 parts, and especially 0.01 to 1 part by weight, per 100 parts by weight of the base resin. Less than 0.001 part of the basic compound may fail to achieve the desired effects thereof, while the use of more than 2 parts would result in too low a sensitivity.

Component (E)

The dissolution inhibitor (E) is preferably selected from compounds possessing a weight average molecular weight of 100 to 1,000 and having on the molecule at least two phenolic hydroxyl groups, in which an average of from 10 to 100 mol % of all the hydrogen atoms on the phenolic hydroxyl groups are replaced with acid labile groups.

Illustrative, non-limiting, examples of the dissolution inhibitor (E) which are useful herein include bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl) methane, bis(4-(1'-ethoxypropyloxy)phenyl)methane, 2,2-bis(4'-(2"-tetrahydropyranyloxy))propane, 2,2-bis(4'-(2"-tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)phenyl) propane, tert-butyl 4,4-bis(4'-(2"-tetrahydropyranyloxy) phenyl)-valerate, tert-butyl 4,4-bis(4'-(2"-tetrahydrofuranyloxy)phenyl)-valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)-valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl) methane, tris(4-(1'-ethoxypropyloxy)phenyl)methane, 1,1,2-tris(4'-(2"-tetrahydropyranyloxy)phenyl)ethane, 1,1,2-tris (4'-(2"-tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, and 1,1,2-tris(4'-(1'-ethoxypropyloxy)phenyl)ethane.

The compounds serving as dissolution inhibitor have a weight average molecular weight of 100 to 1,000, preferably 150 to 800. An appropriate amount of the dissolution inhibitor (E) is 0 to about 50 parts, preferably about 5 to 50 parts, and especially about 10 to 30 parts by weight per 100 parts by weight of the base resin. Less amounts of the dissolution inhibitor may fail to yield an improved resolution, whereas too much amounts would lead to slimming of the patterned film, and thus a decline in resolution. The inhibitor may be used singly or as a mixture of two or more thereof.

The resist composition of the invention may include optional ingredients, typically a surfactant which is commonly used for improving the coating characteristics. Optional ingredients may be added in conventional amounts so long as this does not compromise the objects of the invention.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (Dai-Nippon Ink & Chemicals, Inc.), Florade FC430 and FC431 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC430, Surflon S-381, Surfynol E1004, KH-20 and KH-30 are preferred. These surfactants may be used alone or in admixture.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation such as deep-UV rays, excimer laser beams, or x-rays in a dose of about 1 to 200 mJ/cm², and preferably about 10 to 100 mJ/cm², then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate.

Of the various types of high-energy radiation that may be used, the resist composition of the invention is best suited to micro-pattern formation with, in particular, deep-UV rays having a wavelength of 254 to 120 nm, an excimer laser, especially ArF excimer laser (193 nm), $F_2$ excimer laser (157 nm), $Kr_2$ excimer laser (146 nm), KrAr excimer laser (134 nm) or $Ar_2$ excimer laser (126 nm), x-rays, or an electron beam. Recommended is exposure to high-energy radiation in a wavelength band of 100 to 180 nm or 1 to 30 nm, specifically $F_2$ laser beam, $Ar_2$ laser beam or soft x-ray. The desired pattern may not be obtainable outside the upper and lower limits of the above range.

The resist composition of the invention uses as the base resin a blend of Polymer (1) which is sensitive to high-energy radiation and highly transparent at a wavelength of up to 200 nm, and a sulfonate-containing polymer exhibiting a high contrast upon alkali dissolution, especially Polymer (2) or (3). Due to the use of such a polymer blend, the resist composition is improved in transparency and alkali dissolution contrast as well as plasma etching resistance. These features permit the inventive resist composition to easily form a finely defined pattern having sidewalls perpendicular to the substrate and a high aspect ratio through $F_2$ laser exposure, making the resist ideal as a micropatterning material in VLSI fabrication.

EXAMPLE

Examples of the invention are given below by way of illustration and not by way of limitation.

Evaluation

Polymer Transmittance Measurement

The polymers shown below were determined for transmittance. Each polymer, 1 g, was thoroughly dissolved in 12 g of propylene glycol monomethyl ether acetate (PGMEA), and passed through a 0.2-μm filter, obtaining a polymer solution. The polymer solution was spin coated onto a $MgF_2$ substrate and baked on a hot plate at 100° C. for 90 seconds, forming a polymer film of 200 nm thick on the substrate. Using a vacuum ultraviolet spectrometer (VUV-200S by Nihon Bunko Co., Ltd.), the polymer film was measured for transmittance at 248 nm, 193 nm and 157 nm. The results are shown in Table 1.

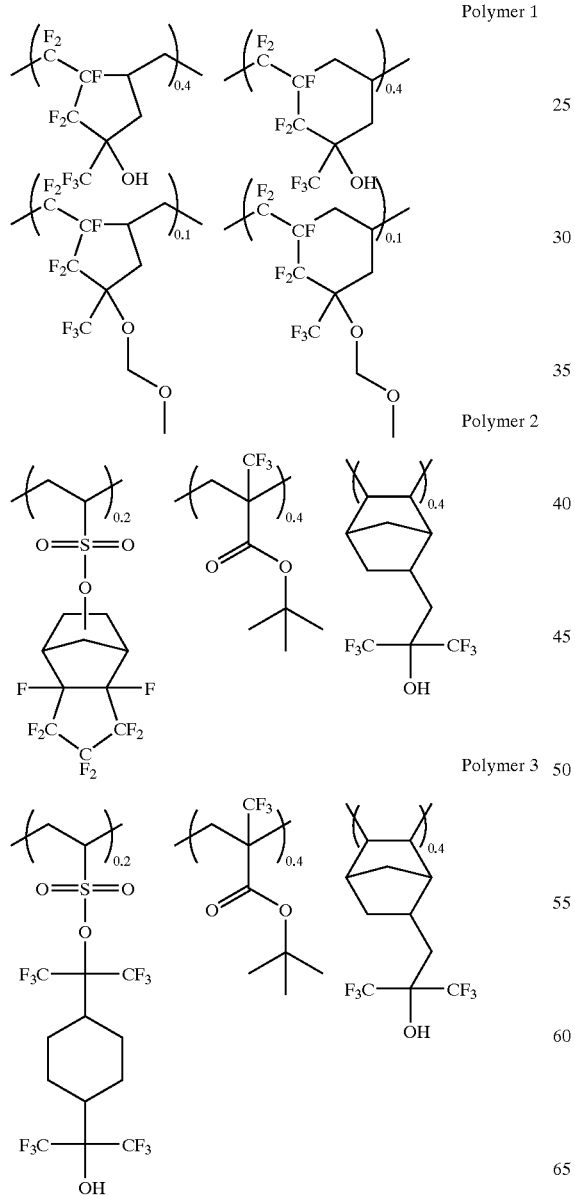

Polymer 1

Polymer 2

Polymer 3

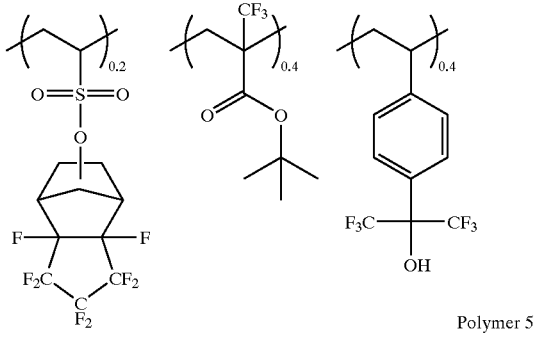

Polymer 4

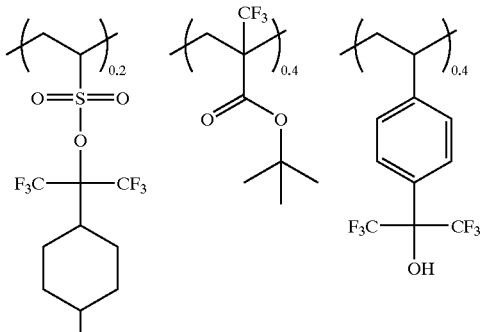

Polymer 5

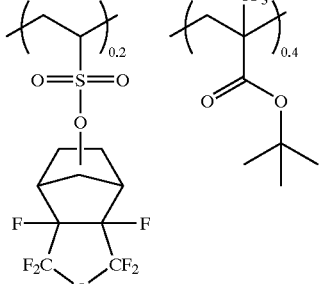

Polymer 6

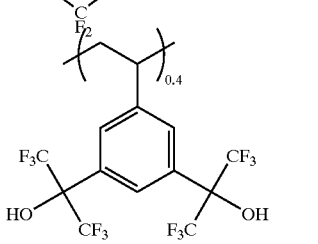

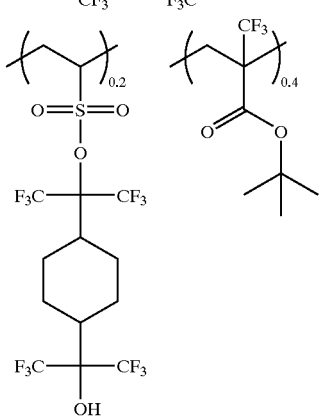

Polymer 7

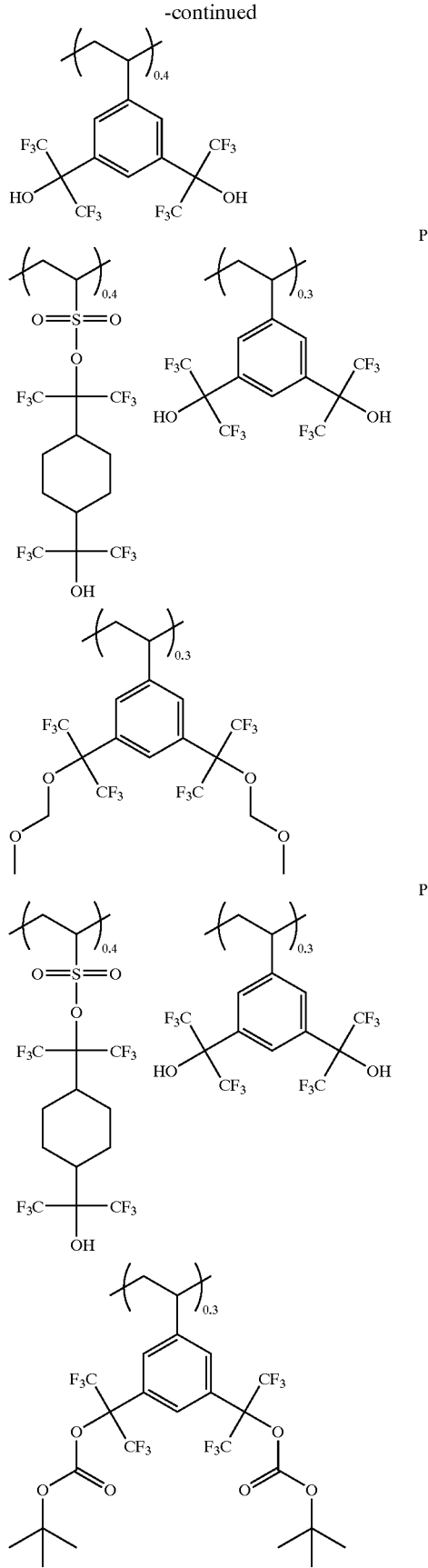

TABLE 1

| | | Transmittance (%) | | |
|---|---|---|---|---|
| | Polymer (blend ratio) | 248 nm | 193 nm | 157 nm |
| Example | Polymer 1 + Polymer 2 (7:3) | 93 | 91 | 61 |
| | Polymer 1 + Polymer 2 (5:5) | 92 | 89 | 53 |
| | Polymer 1 + Polymer 3 (7:3) | 92 | 92 | 62 |
| | Polymer 1 + Polymer 4 (7:3) | 92 | 66 | 58 |
| | Polymer 1 + Polymer 5 (7:3) | 92 | 65 | 59 |
| | Polymer 1 + Polymer 6 (7:3) | 92 | 64 | 61 |
| | Polymer 1 + Polymer 7 (7:3) | 92 | 63 | 62 |
| | Polymer 1 + Polymer 8 (7:3) | 92 | 64 | 63 |
| | Polymer 1 + Polymer 9 (7:3) | 92 | 64 | 61 |
| Comparative | Polymer 1 | 93 | 92 | 71 |
| Example | Polymer 2 | 92 | 87 | 38 |
| | Polymer 3 | 93 | 92 | 40 |
| | Polymer 4 | 91 | 4 | 29 |
| | Polymer 5 | 92 | 6 | 31 |
| | Polymer 6 | 92 | 2 | 38 |
| | Polymer 7 | 93 | 3 | 42 |
| | Polymer 8 | 90 | 2 | 44 |
| | Polymer 9 | 89 | 2 | 39 |

It is evident from Table 1 that although Polymers 2 to 9 which are vinyl sulfonate-containing resins are less transparent at the $F_2$ laser wavelength (157 nm) when used alone, blends of Polymers 2 to 9 with Polymer 1 have a fully high transparency.

Resist Preparation and Exposure

Resist solutions were prepared in a conventional manner by dissolving amounts as shown in Table 2 of the polymer, photoacid generator (PAG1 or PAG2), basic compound (tributylamine, TMMEA, AAA or AACN), and dissolution inhibitor (DRI1) in 1,000 parts of propylene glycol monomethyl ether acetate (PGMEA).

On silicon wafers having a film of DUV-30 (Brewer Science) coated to a thickness of 85 nm, the resist solutions were spin coated, then baked on a hot plate at 130° C. for 90 seconds to give resist films having a thickness of 200 nm.

The resist films were exposed by means of an $F_2$ excimer laser (VUVES-4500 by Lithotec Japan Co., Ltd.) while varying the exposure dose. Immediately after exposure, the resist films were baked (PEB) at 130° C. for 90 seconds and then developed for 60 seconds with a 2.38% aqueous solution of tetramethylammonium hydroxide. The film thickness was measured in different dose areas. From the residual film thickness-to-dose relationship, the sensitivity (Eth) was determined as the exposure dose giving a film thickness 0. A γ value which was the slope (tanθ) of the characteristic curve was also determined.

Separately, through a mask having a Cr pattern formed on a $MgF_2$ substrate, the resist film in close contact with the Cr pattern surface was exposed to a $F_2$ laser for effecting contact exposure. The exposure was followed by similar PEB and development, forming a pattern. A cross section of the pattern was observed under SEM, the ascertainable minimum pattern size giving a resolution.

Table 3 shows the results of the exposure test on the use of Polymers 1 to 9 alone. The resist solution was similarly prepared by dissolving 100 parts by weight of each polymer, 4 parts by weight of PAG1 as the photoacid generator, and 0.1 part by weight of tributylamine as the basic compound in 1,000 parts by weight of PGMEA as the solvent.

TABLE 2

Examples

| Polymer (pbw) | Photoacid generator (pbw) | Basic compound (pbw) | Dissolution inhibitor (pbw) | Eth, mJ/cm$^2$ | γ | Resolution (μm) |
|---|---|---|---|---|---|---|
| Polymer 1 (70) Polymer 2 (30) | PAG1 (4) | tributylamine (0.1) | — | 9.8 | 10.2 | 0.14 |
| Polymer 1 (50) Polymer 2 (50) | PAG1 (4) | tributylamine (0.1) | — | 10.5 | 11.2 | 0.14 |
| Polymer 1 (70) Polymer 3 (30) | PAG1 (4) | tributylamine (0.1) | — | 11.5 | 12.8 | 0.12 |
| Polymer 1 (70) Polymer 4 (30) | PAG1 (4) | tributylamine (0.1) | — | 8.8 | 10.5 | 0.14 |
| Polymer 1 (70) Polymer 5 (30) | PAG1 (4) | tributylamine (0.1) | — | 7.8 | 10.2 | 0.14 |
| Polymer 1 (70) Polymer 6 (30) | PAG1 (4) | tributylamine (0.1) | — | 7.6 | 9.2 | 0.14 |
| Polymer 1 (70) Polymer 7 (30) | PAG1 (4) | tributylamine (0.1) | — | 8.2 | 9.8 | 0.14 |
| Polymer 1 (70) Polymer 8 (30) | PAG1 (4) | tributylamine (0.1) | — | 7.8 | 9.8 | 0.14 |
| Polymer 1 (70) Polymer 9 (30) | PAG1 (4) | tributylamine (0.1) | — | 6.7 | 10.1 | 0.14 |
| Polymer 1 (70) Polymer 3 (30) | PAG1 (4) | TMMEA (0.1) | — | 9.2 | 12.2 | 0.12 |
| Polymer 1 (70) Polymer 3 (30) | PAG1 (4) | AAA (0.1) | — | 9.8 | 13.2 | 0.12 |
| Polymer 1 (70) Polymer 3 (30) | PAG1 (4) | ASCN (0.1) | — | 12.2 | 15.0 | 0.12 |
| Polymer 1 (70) Polymer 3 (30) | PAG1 (4) | tributylamine (0.1) | DRI1 (10) | 8.2 | 10.2 | 0.12 |
| Polymer 1 (70) Polymer 3 (30) | PAG2 (4) | tributylamine (0.1) | — | 6.8 | 16.2 | 0.12 |

TABLE 3

Comparative Examples

| Polymer | Eth (mJ/cm$^2$) | γ | Resolution (μm) |
|---|---|---|---|
| Polymer 1 | 8.5 | 6.3 | 0.16 |
| Polymer 2 | 12.0 | 9.5 | 0.16 |
| Polymer 3 | 10.5 | 11.2 | 0.16 |
| Polymer 4 | 8.7 | 8.5 | 0.16 |
| Polymer 5 | 7.2 | 8.8 | 0.16 |
| Polymer 6 | 5.5 | 7.8 | 0.16 |
| Polymer 7 | 6.2 | 8.8 | 0.16 |
| Polymer 8 | 3.6 | 8.2 | 0.17 |
| Polymer 9 | 4.4 | 7.2 | 0.17 |

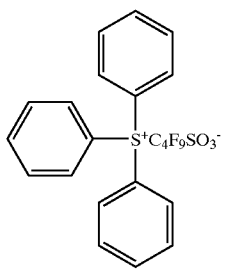

PAG1

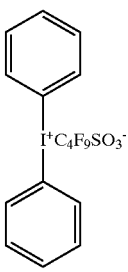

PAG2

TABLE 3-continued

Comparative Examples

DRI1

TMMEA

AAA

AACN

Dry Etching Test

Each polymer, 2 g, was thoroughly dissolved in 10 g of PGMEA, and passed through a filter having a pore size of 0.2 Am, obtaining a polymer solution. The polymer solution was spin coated onto a silicon substrate and baked, forming a polymer film of 300 nm thick. Dry etching tests were carried out on the polymer films by etching them under two sets of conditions. In an etching test with $CHF_3/CF_4$ gas, a dry etching instrument TE-8500P (Tokyo Electron K.K.) was used. In an etching test with $Cl_2/BCl_3$ gas, a dry etching instrument L-507D-L (Nichiden Anerba K.K.) was used. In each test, the difference in polymer film thickness before and after etching was determined. The etching conditions are summarized in Table 4 and the test results are shown in Table 5.

TABLE 4

| | $CHF_3/CF_4$ gas | $Cl_2/BCl_3$ gas |
|---|---|---|
| Chamber pressure (Pa) | 40.0 | 40.0 |
| RF power (W) | 1300 | 300 |
| Gap (mm) | 9 | 9 |
| Gas flow rate (ml/min) | $CHF_3$: 30 | $Cl_2$: 30 |
| | $CF_4$: 30 | $BCl_3$: 30 |
| | Ar: 100 | $CHF_3$: 100 |
| | | $O_2$: 2 |
| Time (sec) | 30 | 30 |

TABLE 5

| | Polymer | $CHF_3/CF_4$ gas etching rate (nm/min) | $Cl_2/BCl_3$ gas etching rate (nm/min) |
|---|---|---|---|
| Example | Polymer 1 (70) Polymer 2 (30) | 220 | 280 |
| | Polymer 1 (50) Polymer 2 (50) | 178 | 266 |
| | Polymer 1 (70) Polymer 3 (30) | 211 | 222 |
| | Polymer 1 (70) Polymer 4 (30) | 204 | 233 |

TABLE 5-continued

| | Polymer | $CHF_3/CF_4$ gas etching rate (nm/min) | $Cl_2/BCl_3$ gas etching rate (nm/min) |
|---|---|---|---|
| | Polymer 1 (70) Polymer 5 (30) | 209 | 228 |
| | Polymer 1 (70) Polymer 6 (30) | 225 | 226 |
| | Polymer 1 (70) Polymer 7 (30) | 228 | 235 |
| | Polymer 1 (70) Polymer 8 (30) | 222 | 238 |
| | Polymer 1 (70) Polymer 9 (30) | 222 | 237 |
| Comparative Example | Polymer 1 (100) | 280 | 350 |

As is evident from the above results, resist compositions using polymer blends within the scope of the invention have a high transparency at the wavelength (157 nm) of the $F_2$ laser. It is also confirmed that upon exposure to VUV, these resist compositions exert the positive working effect that the film thickness decreases with an increasing exposure dose as well as a high γ value and high contrast. They also exhibit a high resolution upon contact exposure and excellent resistance to dry etching.

Japanese Patent Application No. 2002-310572 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A resist composition comprising as the base resin a polymer comprising recurring units of the following general formulae (1a) and (1b):

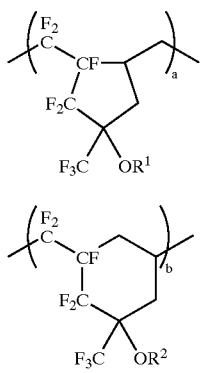

(1a)

(1b)

wherein $R^1$ and $R^2$ each are hydrogen or an acid labile group, "a" and "b" are numbers satisfying $0<a<1$, $0<b<1$ and $0<a+b\leq 1$, and another polymer comprising recurring units containing sulfonate.

2. The resist composition of claim 1 wherein the recurring units containing sulfonate are represented by the general formulae (2a), (2b) and (2c):

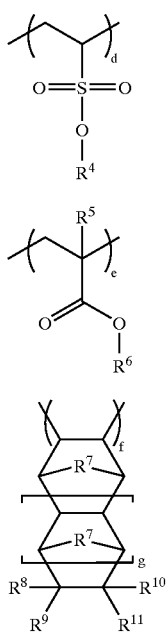

(2a)

(2b)

(2c)

wherein $R^4$ is a substituent group containing at least one fluorine atom, $R^5$ is a fluorine atom or a fluorinated alkyl group having 1 to 4 carbon atoms, $R^6$ is an acid labile group, $R^7$ is a methylene group, oxygen atom or sulfur atom, $R^8$ to $R^{11}$ are independently hydrogen, fluorine, $-R^{12}-OR^{13}$, $-R^{12}-CO_2R^{13}$, or a straight, branched or cyclic alkyl or fluorinated alkyl group of 1 to 20 carbon atoms, at least one of $R^8$ to $R^{11}$ contains $-R^{12}-OR^{13}$ or $-R^{12}-CO_2R^{13}$, $R^{12}$ is a single bond or a straight, branched or cyclic alkylene or fluorinated alkylene group of 1 to 20 carbon atoms, $R^{13}$ is hydrogen or an acid labile group, d, e, and f are numbers satisfying $0<d<1$, $0\leq e<1$, $0\leq f<1$, and $0<d+e+f\leq 1$, and g is 0 or 1.

3. The resist composition of claim 1 wherein the recurring units containing sulfonate are represented by the general formulae (3a), (3b) and (3c):

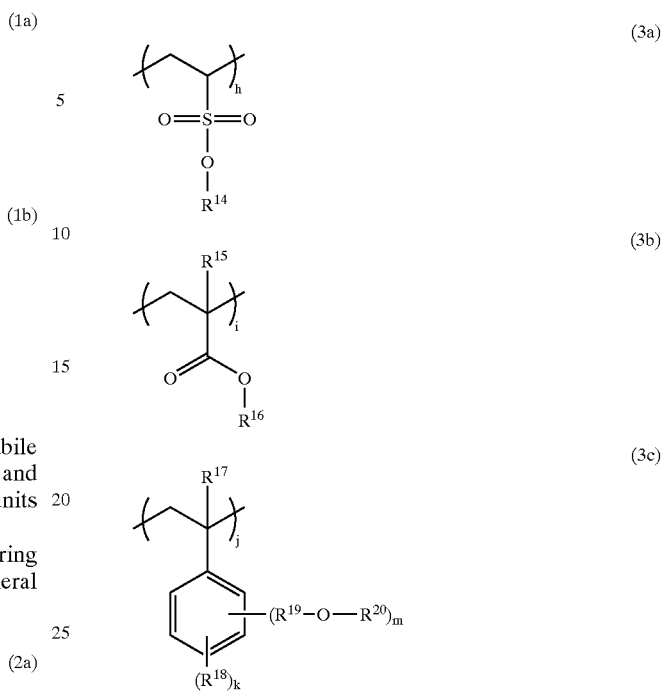

(3a)

(3b)

(3c)

wherein $R^{14}$ is a substituent group containing at least one fluorine atom, $R^{15}$ is a fluorine atom or a fluorinated alkyl group having 1 to 4 carbon atoms, $R^{16}$ is an acid labile group, $R^{17}$ is hydrogen, fluorine or a straight, branched or cyclic alkyl or fluorinated alkyl group of 1 to 20 carbon atoms, $R^{18}$ is fluorine or a straight, branched or cyclic fluorinated alkyl group of 1 to 20 carbon atoms, $R^{19}$ is a single bond or a straight, branched or cyclic alkylene or fluorinated alkylene group of 1 to 20 carbon atoms, $R^{20}$ is hydrogen or an acid labile group, h, i, and j are numbers satisfying $0<h<1$, $0\leq i<1$, $0\leq j<1$, and $0<h+i+j\leq 1$, k is an integer of 0 to 4, m is 1 or 2, and $1\leq k+m\leq 5$.

4. The resist composition of claim 2 wherein the fluorinated substituent group represented by $R^4$ in formula (2a) or $R^{14}$ in formula (3a) has any of the formulae (4a) to (4e):

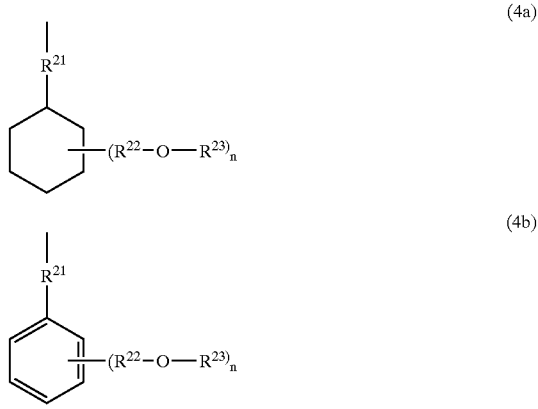

(4a)

(4b)

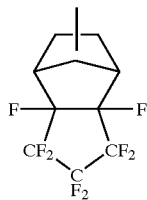
(4c)

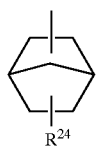
(4d)

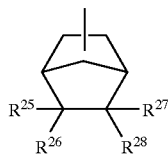
(4e)

wherein $R^{21}$ and $R^{22}$ each are a straight, branched or cyclic fluorinated alkylene group of 1 to 20 carbon atoms, $R^{23}$ is hydrogen or an acid labile group, $R^{24}$ is a straight, branched or cyclic fluorinated alkyl group of 1 to 10 carbon atoms, $R^{25}$ to $R^{28}$ are independently hydrogen, fluorine, —$R^{29}$—$OR^{30}$, —$R^{29}$—$CO_2R^{30}$, or a straight, branched or cyclic alkyl or fluorinated alkyl group of 1 to 20 carbon atoms, at least one of $R^{25}$ to $R^{28}$ contains —$R^{29}$—$OR^{30}$ or —$R^{29}$—$CO_2R^{30}$, $R^{29}$ is a single bond or a straight, branched or cyclic alkylene or fluorinated alkylene group of 1 to 20 carbon atoms, $R^{30}$ is hydrogen or an acid labile group, and n is 1 or 2.

5. A chemically amplified positive resist composition comprising (A) a blend of the polymers set forth in claim 1, (B) an organic solvent, and (C) a photoacid generator.

6. The resist composition of claim 5, further comprising (D) a basic compound.

7. The resist composition of claim 5, further comprising (E) a dissolution inhibitor.

8. A process for forming a resist pattern comprising the steps of:

applying the resist composition of claim 5 onto a substrate to form a coating, heat treating the coating and then exposing it to high-energy radiation in a wavelength band of 100 to 180 nm or 1 to 30 nm through a photomask, and optionally heat treating the exposed coating and developing it with a developer.

9. The pattern forming process of claim 8 wherein the high-energy radiation is an $F_2$ laser beam, $Ar_2$ laser beam or soft x-ray.

* * * * *